(12) United States Patent
Shing

(10) Patent No.: US 7,287,996 B1
(45) Date of Patent: Oct. 30, 2007

(54) FIXING DEVICE AND CONNECTOR USING THE FIXING DEVICE

(75) Inventor: Chung-Hsien Shing, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/490,185

(22) Filed: Jul. 21, 2006

(51) Int. Cl.
*H01R 13/62* (2006.01)

(52) U.S. Cl. .................................. 439/327

(58) Field of Classification Search ............... 439/153, 439/377, 327
See application file for complete search history.

(56) References Cited

U.S. PATENT DOCUMENTS

| | | | |
|---|---|---|---|
| 5,603,628 A * | 2/1997 | Schapiro, Jr. ............... | 439/327 |
| 5,943,218 A * | 8/1999 | Liu ............................ | 361/801 |
| 6,183,284 B1 * | 2/2001 | Gill et al. ................... | 439/327 |
| 6,305,964 B1 * | 10/2001 | Pon et al. ................... | 439/327 |
| 6,319,037 B1 * | 11/2001 | Lai ............................ | 439/327 |
| 6,517,369 B1 * | 2/2003 | Butterbaugh et al. ....... | 439/327 |

\* cited by examiner

*Primary Examiner*—Tho D. Ta
(74) *Attorney, Agent, or Firm*—Troxell Law Office, PLLC

(57) ABSTRACT

A fixing device and a connector using the fixing device can fix and insert directly into the expansion card of the connector. The fixing device includes at least one of the elastic arms. The elastic arm has a buckling portion. The connector using the fixing device includes an insulating body and a fixing device. The fixing device includes at least one of the elastic arms and a buckling portion. The buckling portion is buckled the two distal ends of the insulating body. A stop sheet serves to fix the expansion card. The stop sheet is not only capable of fix firmly the expansion card to the fixing device, but also is instead of screws. Besides, a buckling portion services to fix the fixing device into the connector. The integral structure of the novel way is simple and convenient to be assembled. The novel way can not only increase the assembling efficiency, but also reduce the production costs.

5 Claims, 15 Drawing Sheets

FIXING DEVICE AND CONNECTOR USING THE FIXING DEVICE

BACKGROUND OF THE INVENTION (a) Field of the Invention

The present invention relates to fixing devices and connectors, and in particular to a fixing device capable of fixing and receiving an expansion card of a connector.

(b) Description of the Prior Art

An expansion card of a prior art is fixed in a computer mainframe box by using at least one of screws. However, the fixed method is inconvenient very much for assembling or disassembling the expansion card.

Recently, various kinds of fixing devices of expansion cards are developed in the fixing device industry. For instance, a fixing device of an expansion card is disclosed in U.S. Pat. No. 5,317,483; and a fixing device of an expansion card is disclosed in U.S. Pat. No. 5,936,835. Although both of the fixing devices for expansion cards are more convenient to assemble or disassemble than the prior art, at least one of screws are still needed to fix an expansion card. Therefore, it is still inconvenient for a user to assemble or disassemble the expansion card.

SUMMARY OF THE INVENTION

The primary objective of the present invention is to provide a fixing device convenient to fix, assemble and disassemble an expansion card and a connector using the fixing device.

In order to reach the above objective, the fixing device of the present invention can fix and insert directly into the expansion card of the connector. The fixing device includes at least one of the elastic arms. The elastic arm has a buckling portion.

A connector using the fixing device includes an insulating body and a fixing device. The fixing device includes at least one of elastic arms and a buckling portion. The buckling portion is buckled the two distal ends of the insulating body.

Comparing to the prior art, the present invention has a stop sheet to fix the expansion card. Therefore, the present invention is not only capable of fix firmly the expansion card to the fixing device, but also need not any one screw. Besides, the present invention has a buckling portion so as to fix the fixing device into the connector. The integral structure of the present invention is simple and convenient for a user to assemble. The present invention can not only increase the assembling efficiency, but also reduce the production costs.

DETAILED DESCRIPTION OF THE PREFERRED EMBODIMENTS

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
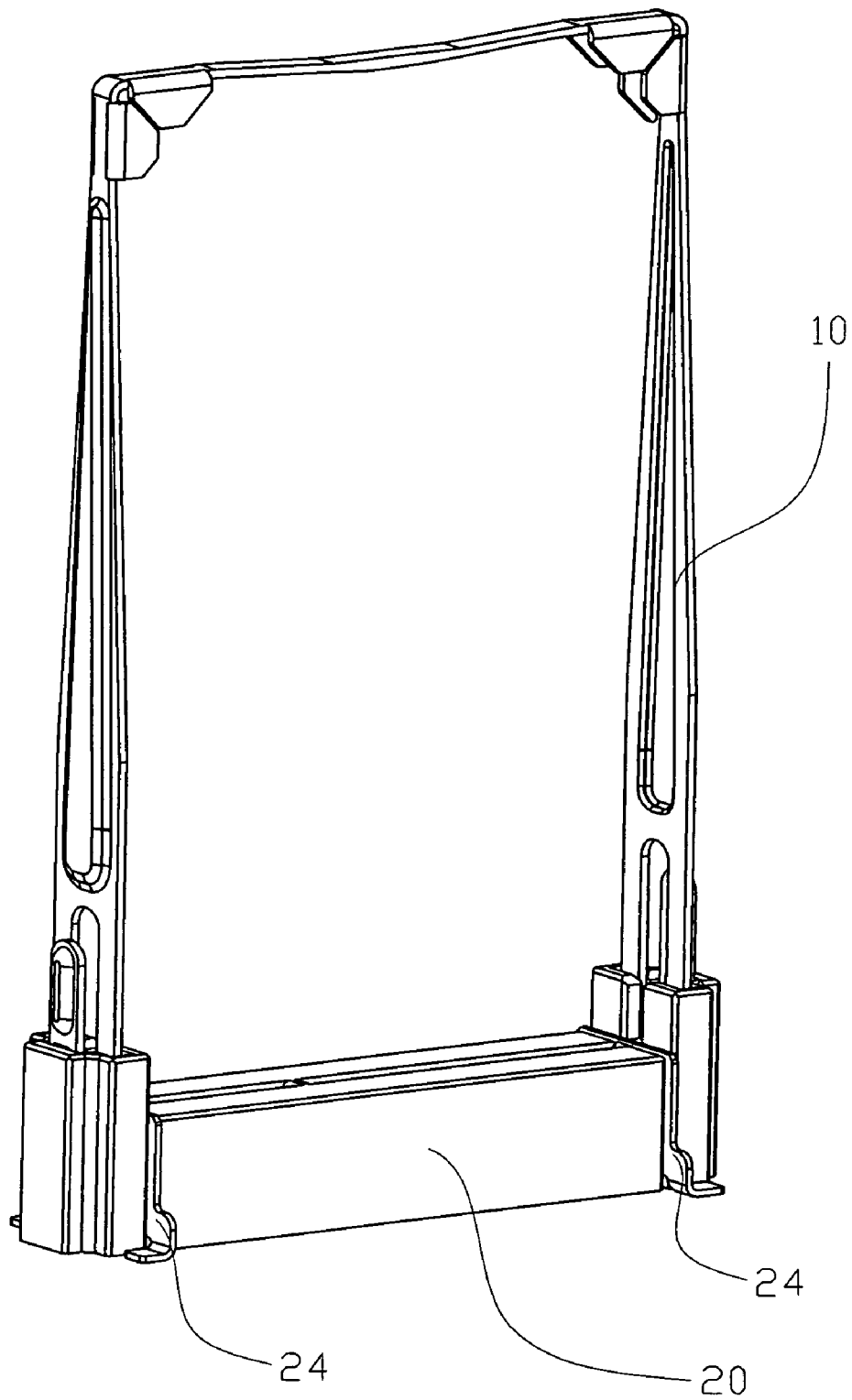
FIG. 1 is the assembled perspective view of the connector of the present invention.
Figure 2:
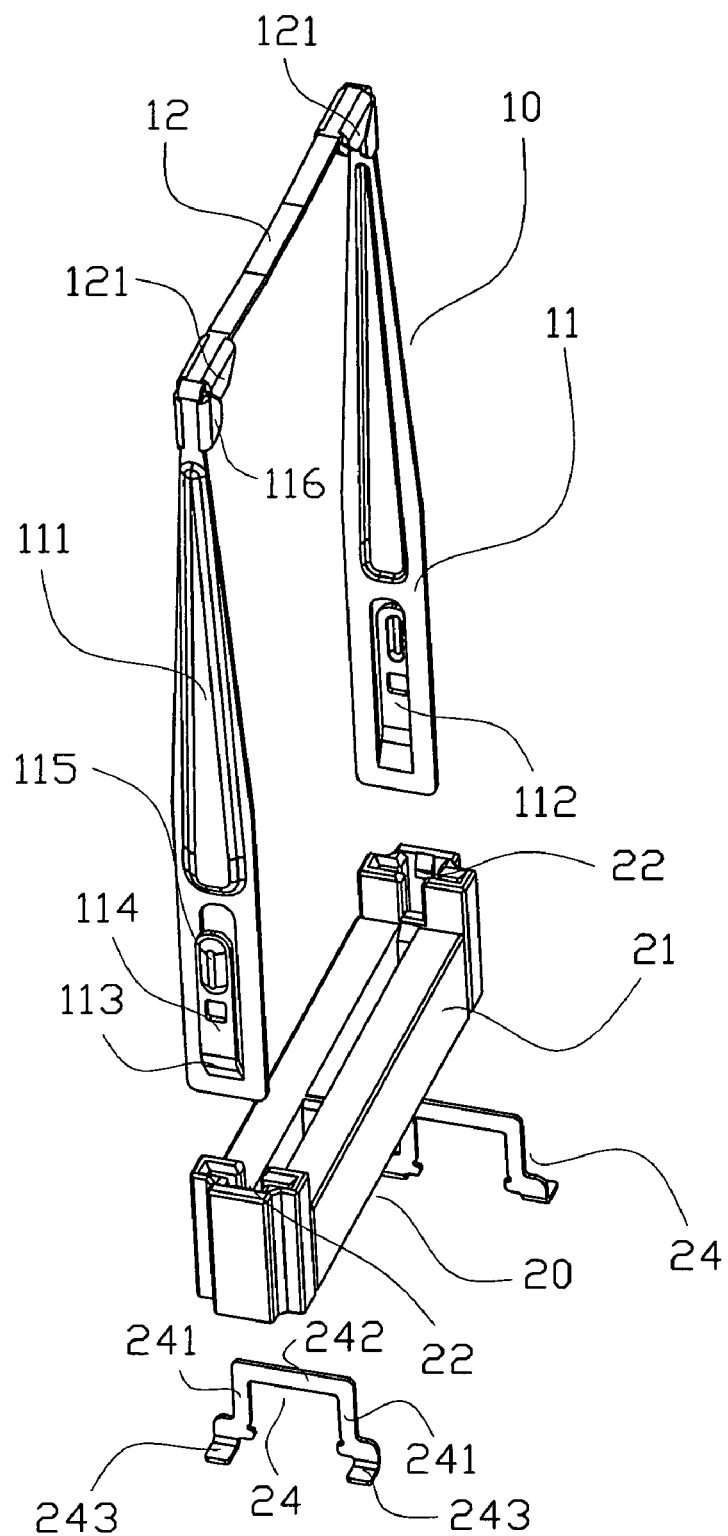
FIG. 2 is the exploded perspective view of the connector of the present invention.
Figure 3:
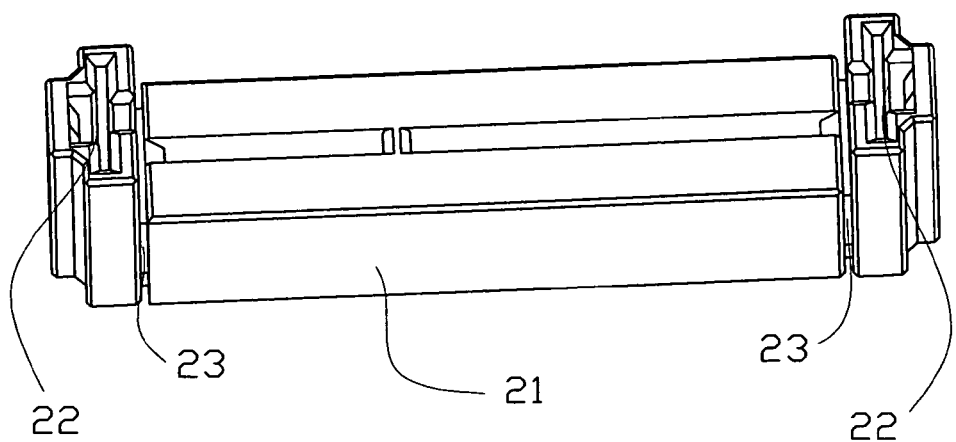
FIG. 3 is the schematic view of the insulating body of the connector showing on the FIG. 2.
Figure 4:
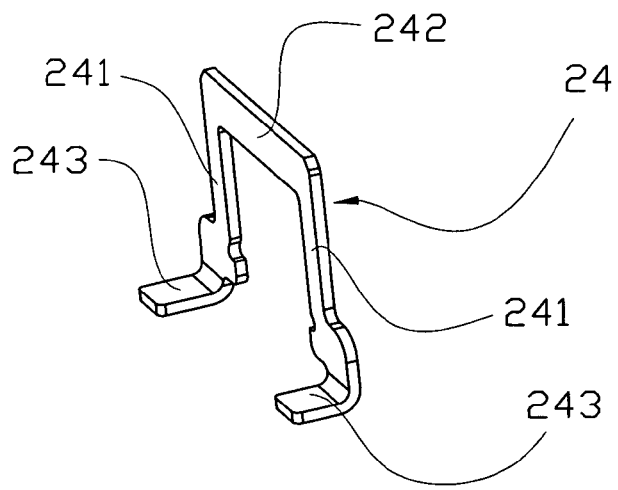
FIG. 4 is the schematic view of the fixing unit of the connector showing on the FIG. 2.
Figure 5:
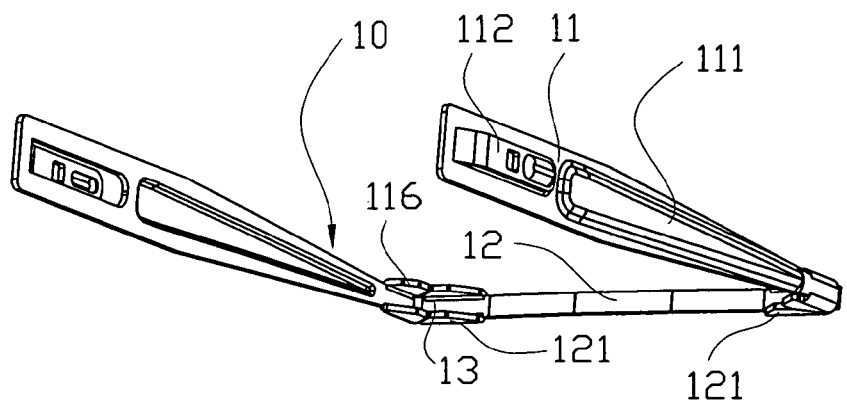
FIG. 5 is the schematic view of the fixing device showing on the FIG. 2.
Figure 6:
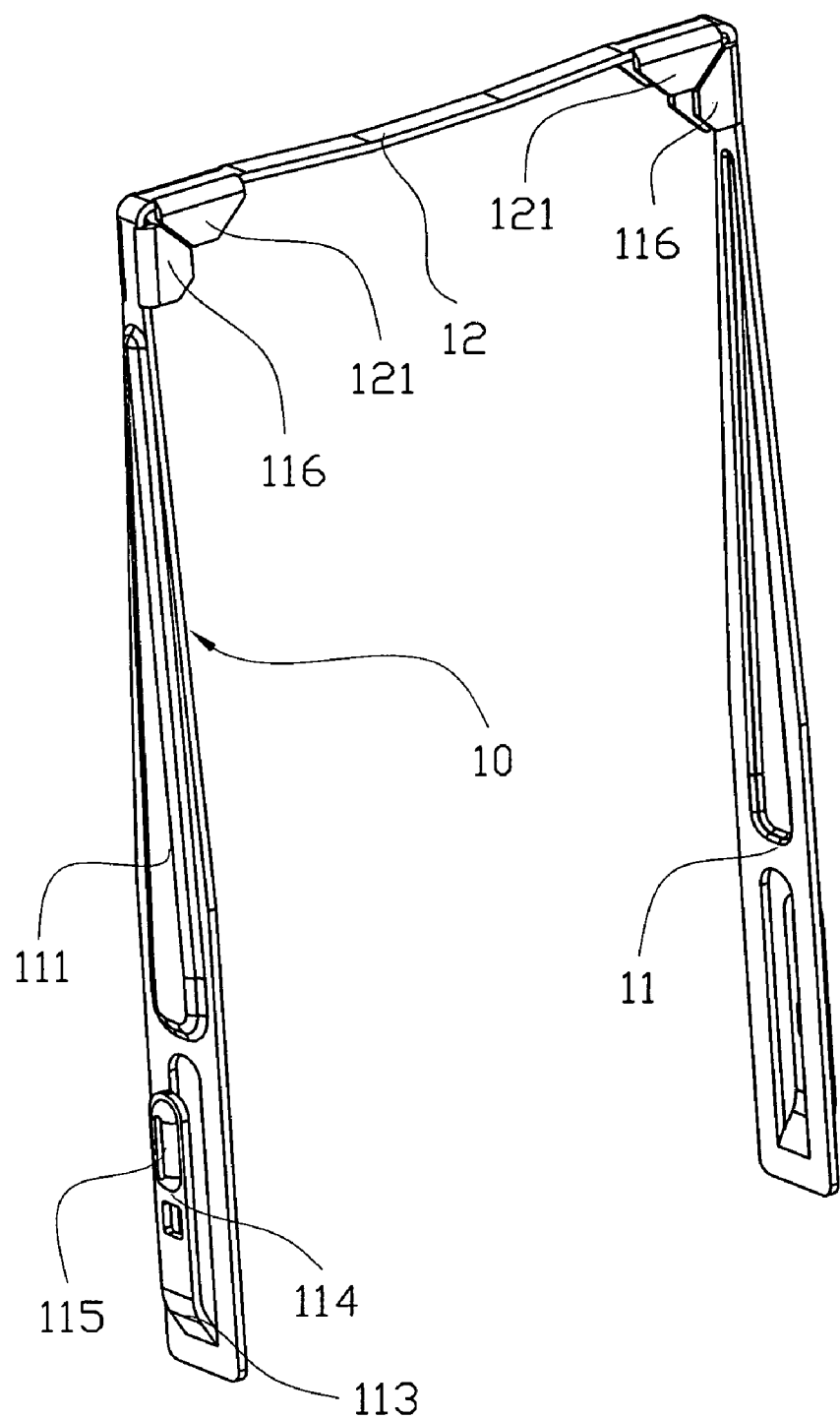
FIG. 6 is the schematic view of the other angle of the fixing device showing on the FIG. 5.
Figure 7:
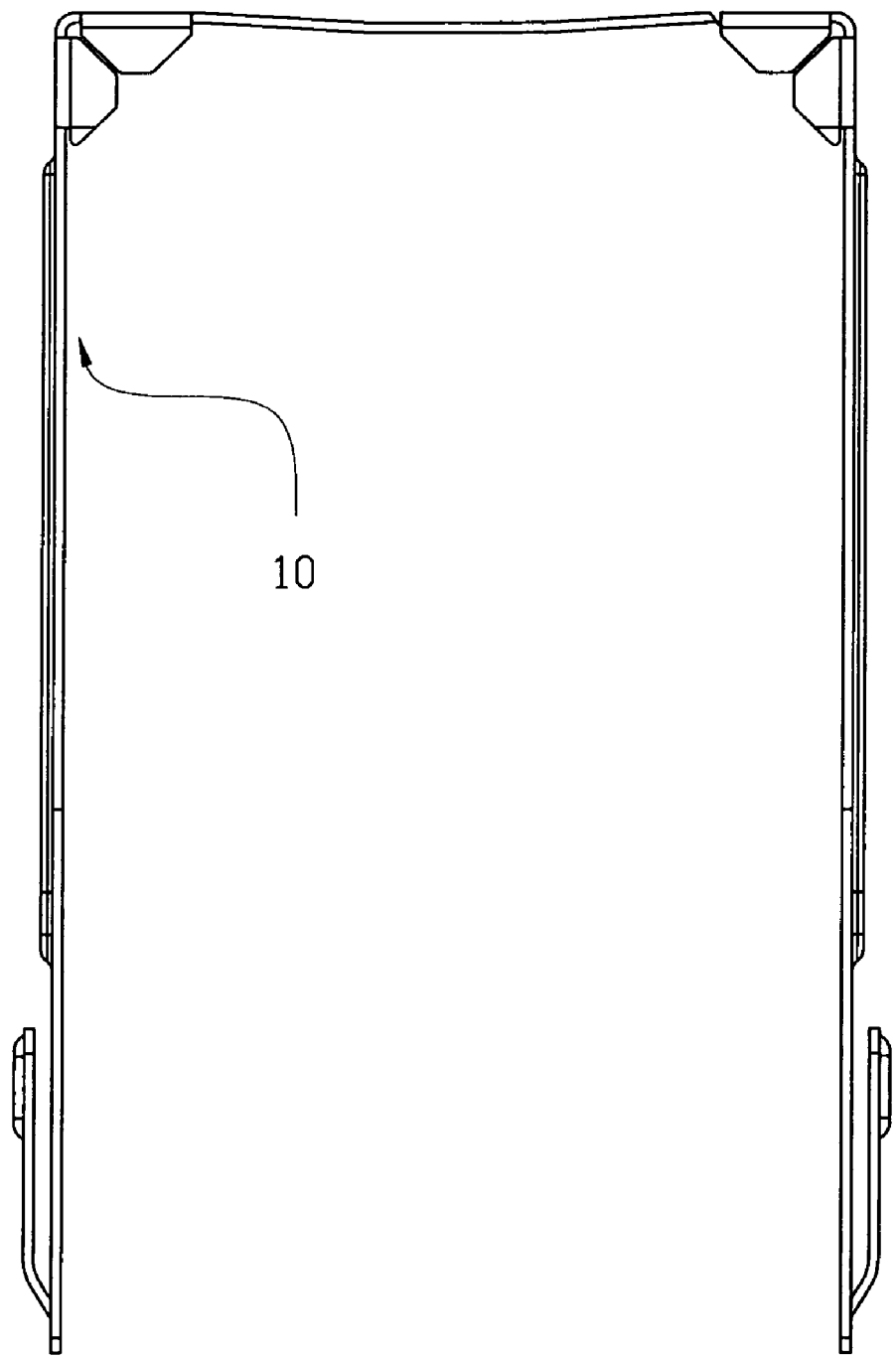
FIG. 7 is the front view of the fixing device showing on the FIG. 5.
Figure 8:
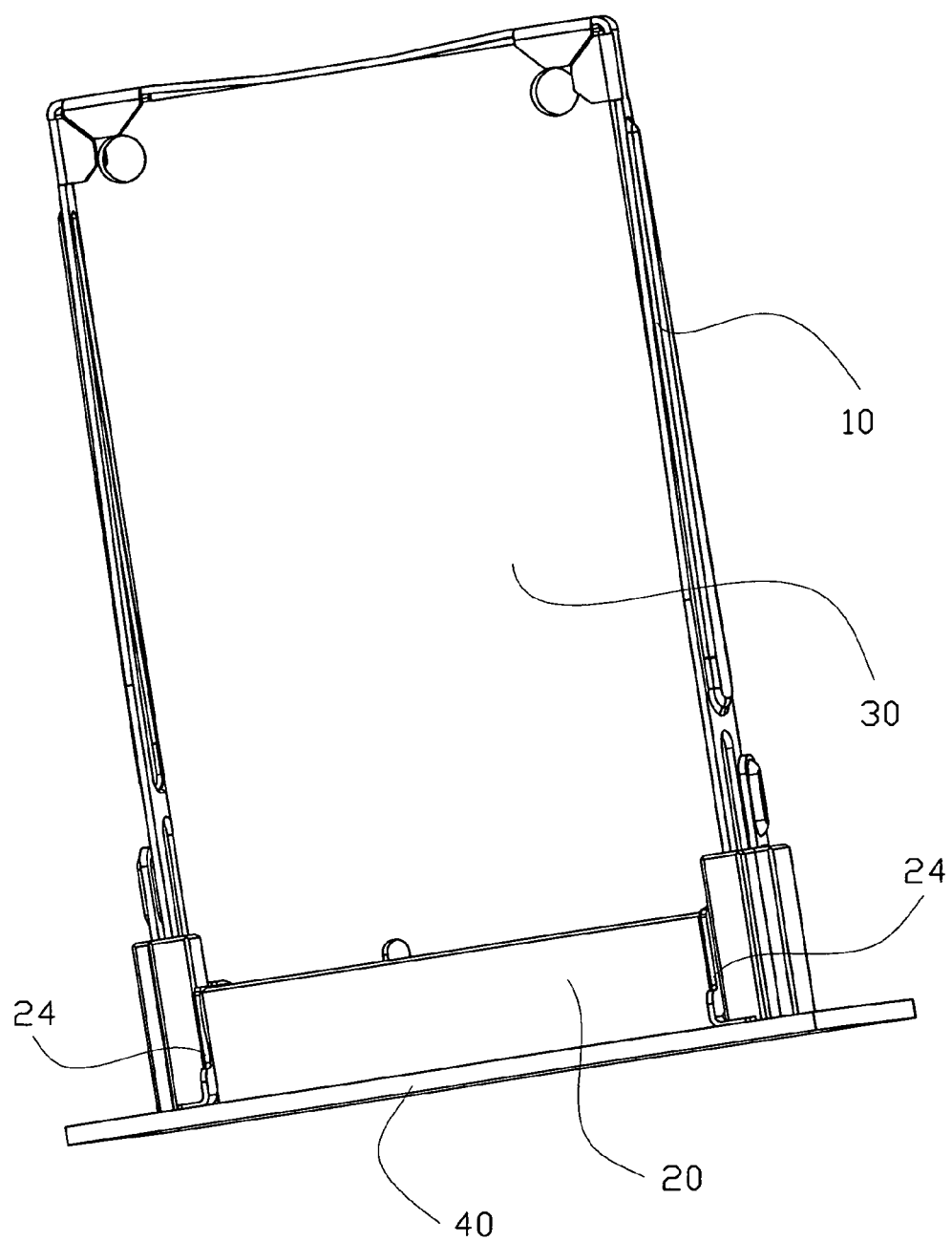
FIG. 8 is the assembled perspective of the connector, expansion card and the circuit board showing on the FIG. 1.
Figure 9:
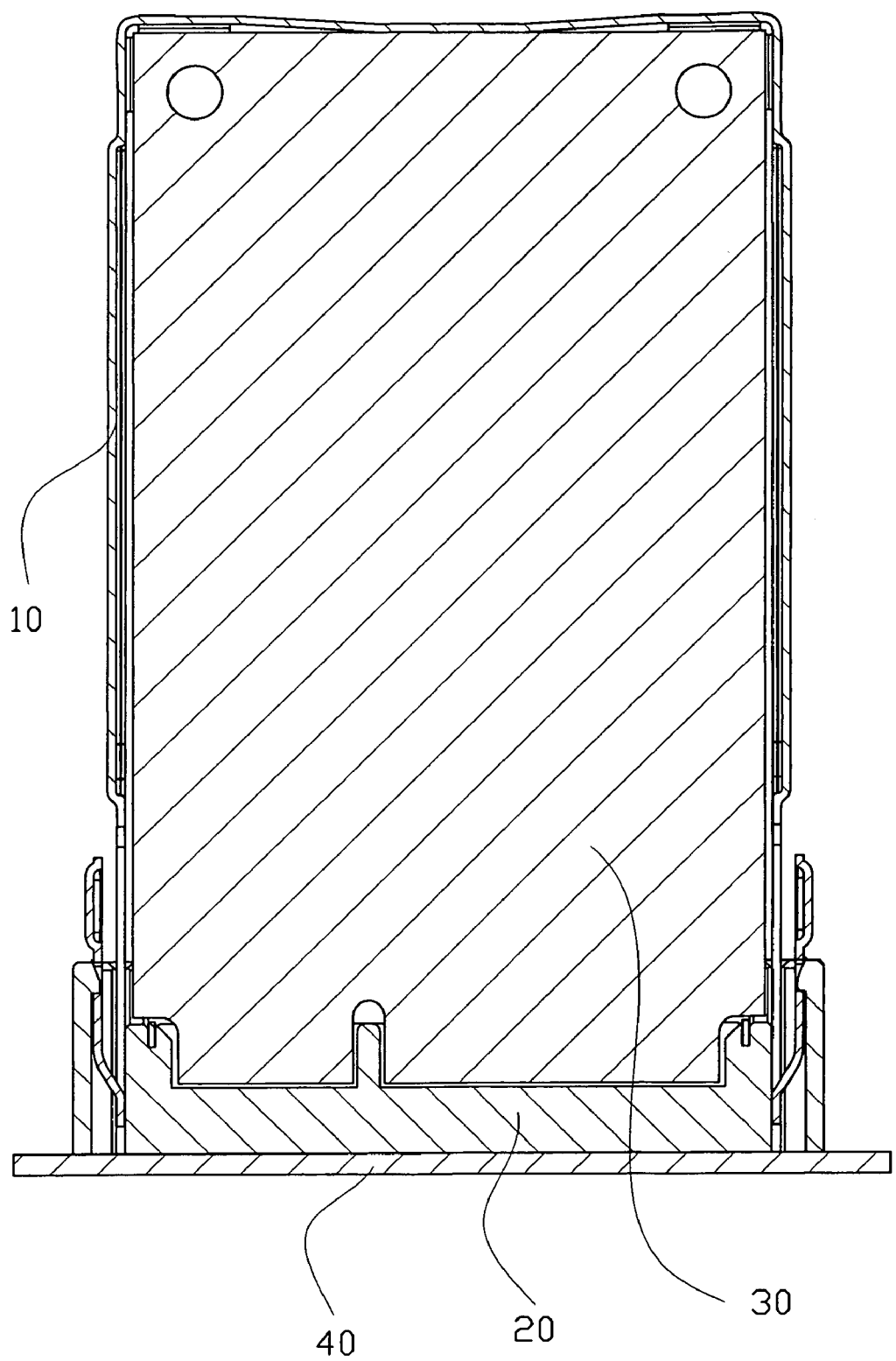
FIG. 9 is the cross-sectional view of the assembled perspective showing on the FIG. 8.
Figure 10:
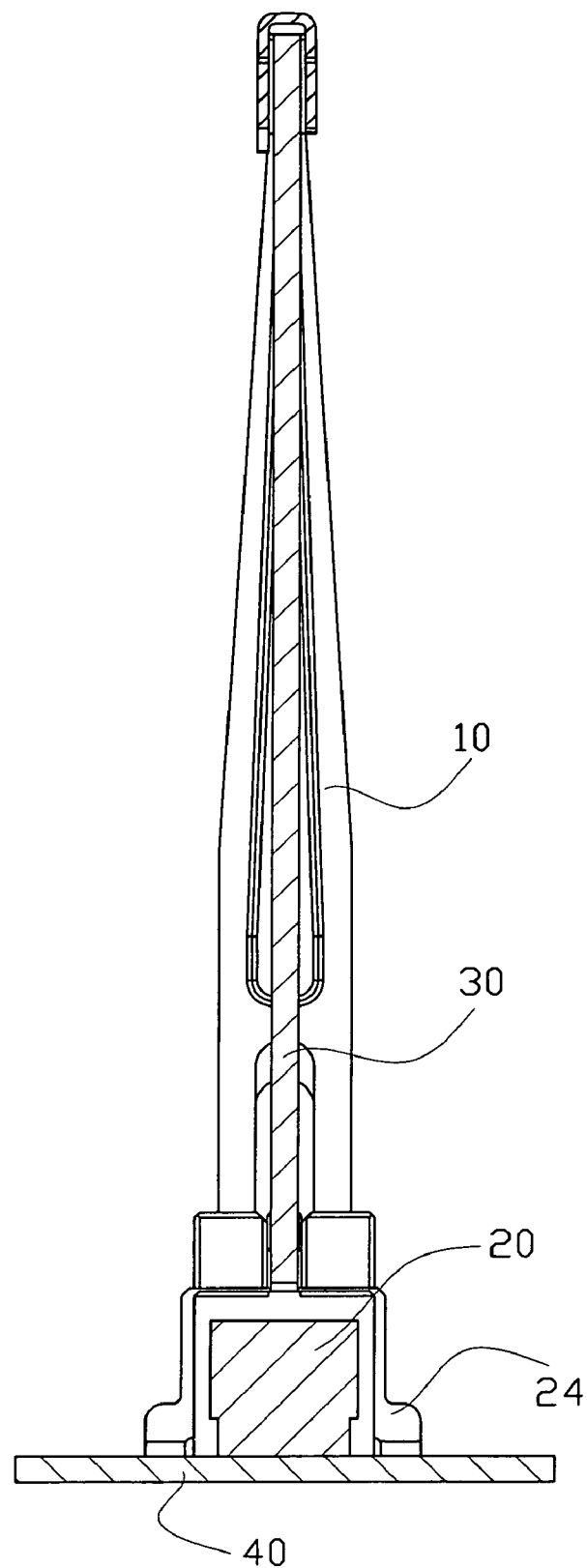
FIG. 10 is the cross-sectional view of the other angle showing on the FIG. 8.

Referring to FIGS. 1 to 10, the fixing device 10 of the present invention is illustrated. The fixing device 10 can be inserted to an expansion card 30 in a connector 20. The connector 20 is welded to a circuit board 40.

The fixing device 10 is integrally made of metal materials and an approximate U shape. The fixing device 10 has the following elements.

Two elastic arms 11 are included. Each elastic arm 11 has a protrusion 111 at an outer lateral middle side. The elastic arm 11 has a reduced size from one end to another end thereof.

A driving portion 112 is formed in a lower end of the elastic arm 11. The driving portion 112 is formed by cutting and bending a part of the elastic arm 11 with a side of the driving portion 112 being connected to the elastic arm 11. Thereby one end of the driving portion 112 is movable insides or outsides. The driving portion 112 has a connecting portion 113 and a vertical portion 114 extending from the connecting portion 113. The vertical portion 114 is approximately vertical to the elastic arm 11. An outer side of the vertical portion 114 is projected with a block 115.

Two the first stop sheets 116 are formed respectively by bending and extending the ends of the two elastic arms 11. A connecting arm 12 is connected to upper ends of the two elastic arms 11. The middle part of the connecting arm 12 is bent inwards. Each end of the connecting arm 12 is also bent and extended to form a second stop sheet 121 corresponding to the first stop sheet 116. Thereby, a slot 13 is formed by the first stop sheet 116 and the second stop sheet 116. The slot 13 is capable of fixing at a right angle of the expansion card 30.

The fixing device 10 is fixed in the connector 20. The connector 20 includes an insulating body 21 with a long shape. The two ends of the insulating body 21 have respectively two first groove 22 and two second grooves 23. The second groove 23 is located at the interior side of the groove 22. The fixing device 10 is installed in the first groove 22. The connector 20 has two metal fixing units 24 so as to weld and fix the connector 20 to the circuit board 40. The fixing units 24 are received in the second grooves 23. The fixing units 24 are made integrally of metal. At least one part of the fixing unit 24 is buckled the surface of the insert card side of the connector 20. The fixing unit 24 is installed across to the connector 20. The fixing unit 24 has a first arm 242 and a second arm 241. The first arm 242 is buckled in the first groove 22. The connector 20 has at least one of the main bodies 20 and an arm portion 245. The first groove 22 is located between the main body 20 and the arm portion 245 (the first groove 22 can also be on the arm portion 245). The second arm portion 241 is formed by extending downwards the below end of the first arm 242. The second arm 241 is buckled in the second groove 23. The lower end of the second arm 241 is bent and extended outwards at least once to form a guiding portion 243 so as to fix the connector 20 on the circuit board 40.

When assembling (referring to FIGS. 1 to 10), firstly, the fixing unit 24 is installed on the corresponding groove 23. Then, the connector 20 is welded and fixed on the circuit board 40. The expansion card 30 is buckled into the insulating body 21 of the connector 20. The expansion card 30 is fixed on the expansion card 30 by pulling the elastic arms 11 outwards suitably so that the interior side of the elastic arms 11 passes through the lateral side of the expansion card 30. Then the upper end of the right angle of the expansion card 30 is received in the slot 13. The first stop sheet 116 and the second stop sheet 121 is leaned respectively against the each side of the expansion card 30 so that the expansion card 30 is received in the fixing device 10. Furthermore, the fixing device 10 is fixed in the connector 20. The buckling portion 112 is pushed inwards firstly. The end part of the elastic arms 11 is inserted into the receiving groove 22. Then the buckling portion 112 is released so that the vertical portion 114 of the buckling portion 112 is leaned against the interior wall of the receiving groove 22. Thereby, the fixing device 10 is fixed in the connector 20.

Figure 11:
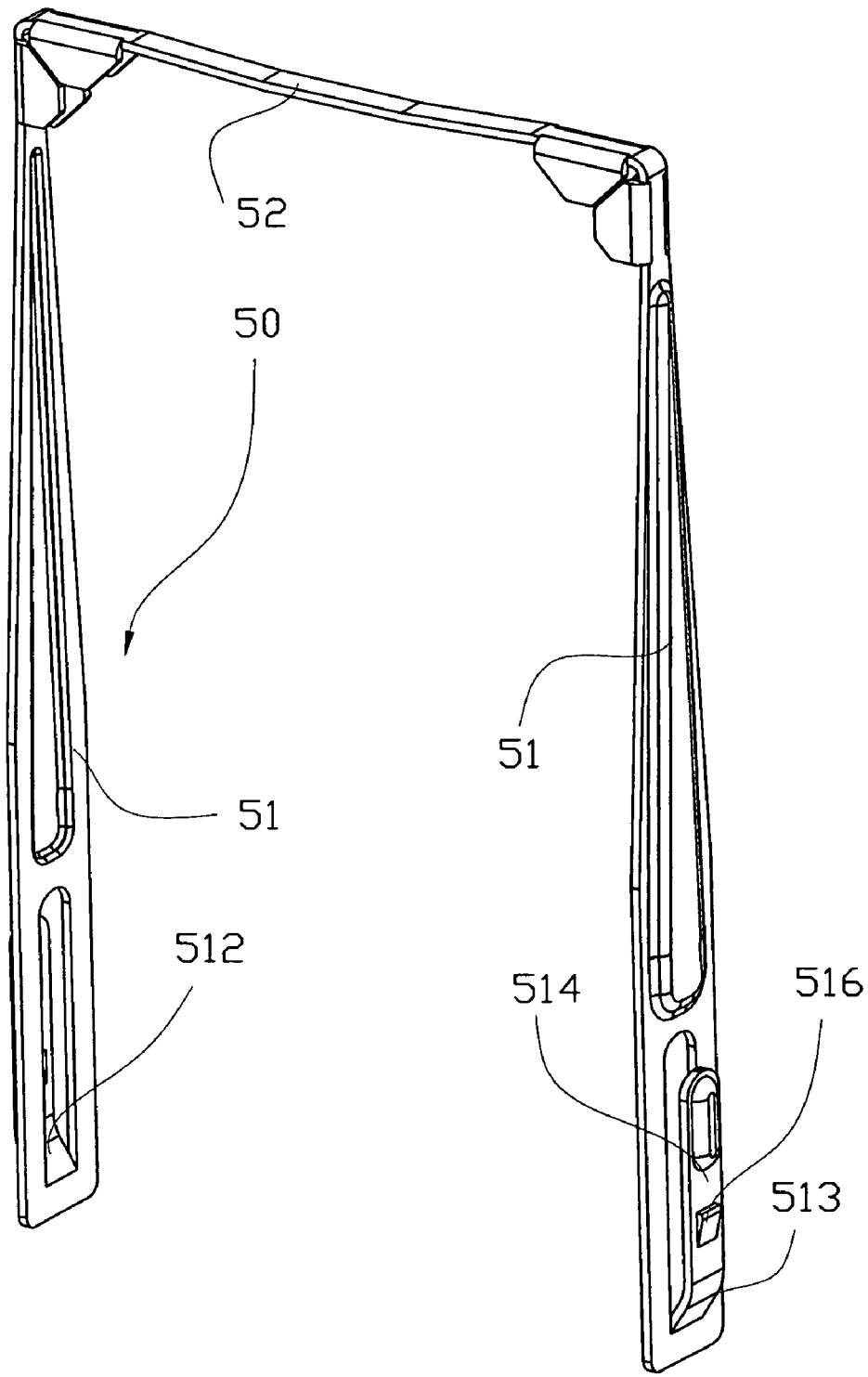
FIG. 11 is the schematic view of the fixing device of the second embodiment of the present invention.
Figure 12:
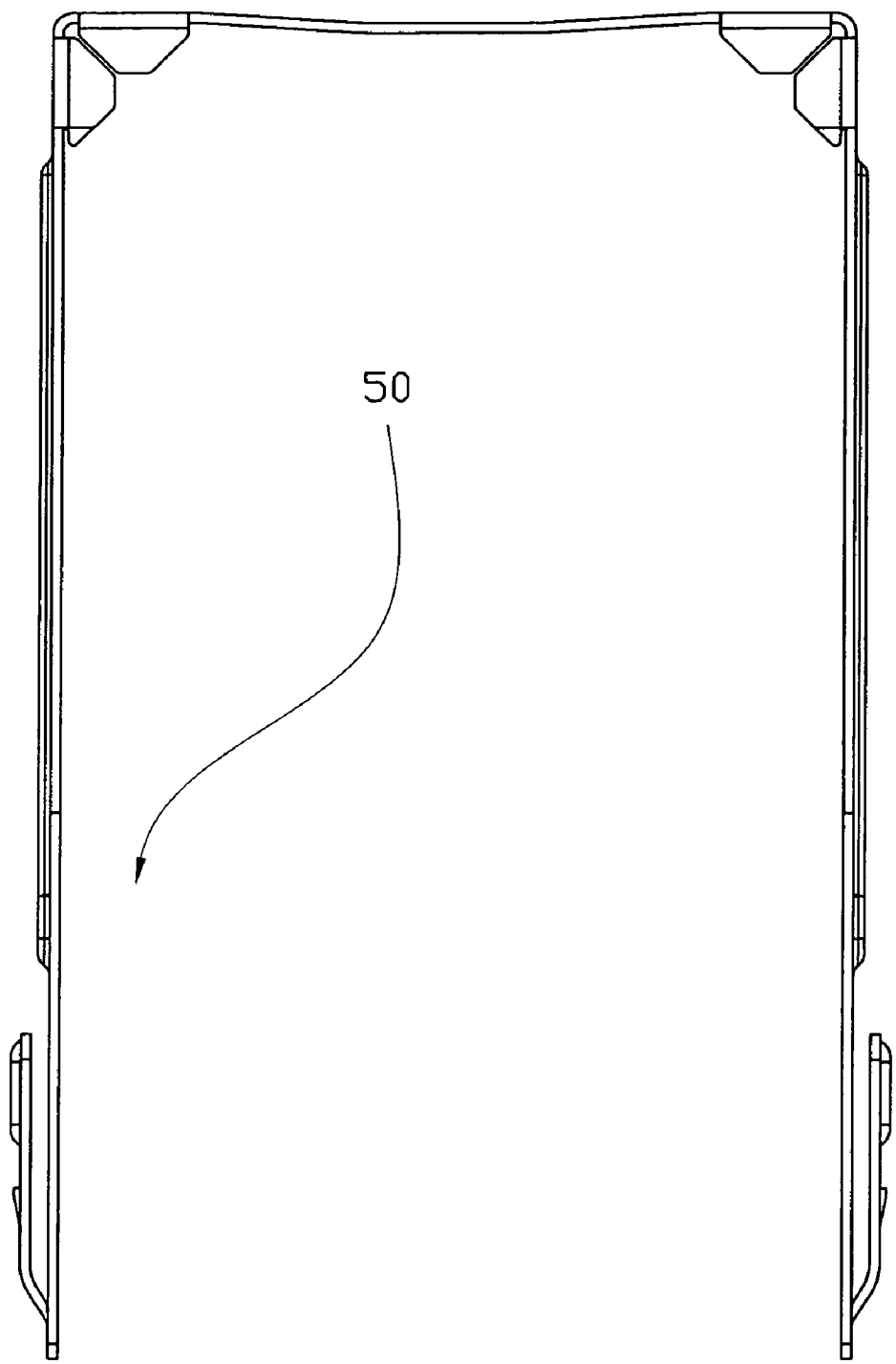
FIG. 12 is the front view of the fixing device showing on the FIG. 11.
Figure 13:
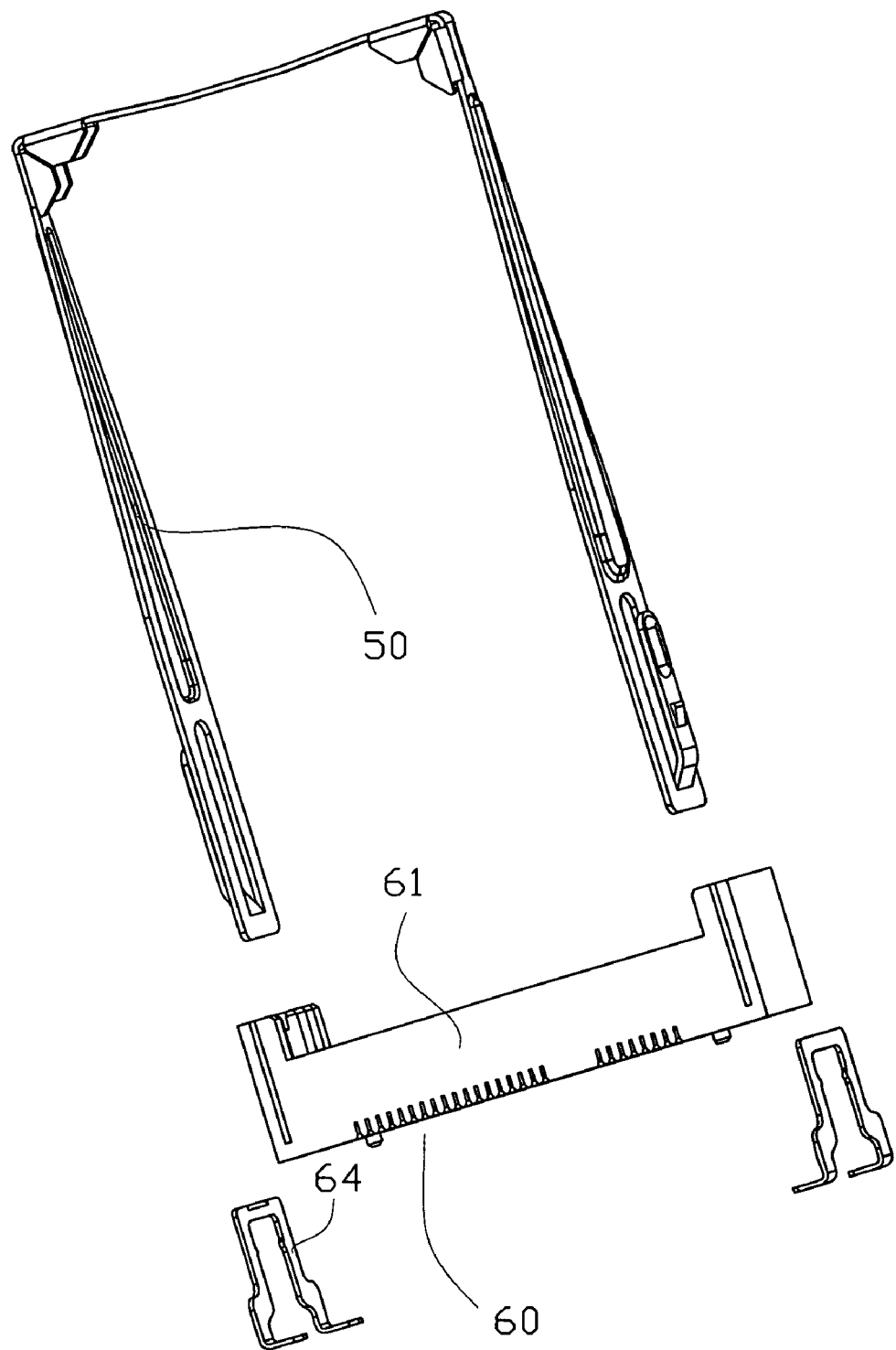
FIG. 13 is the exploded perspective view of the second embodiment of the connector of the present invention.
Figure 14:
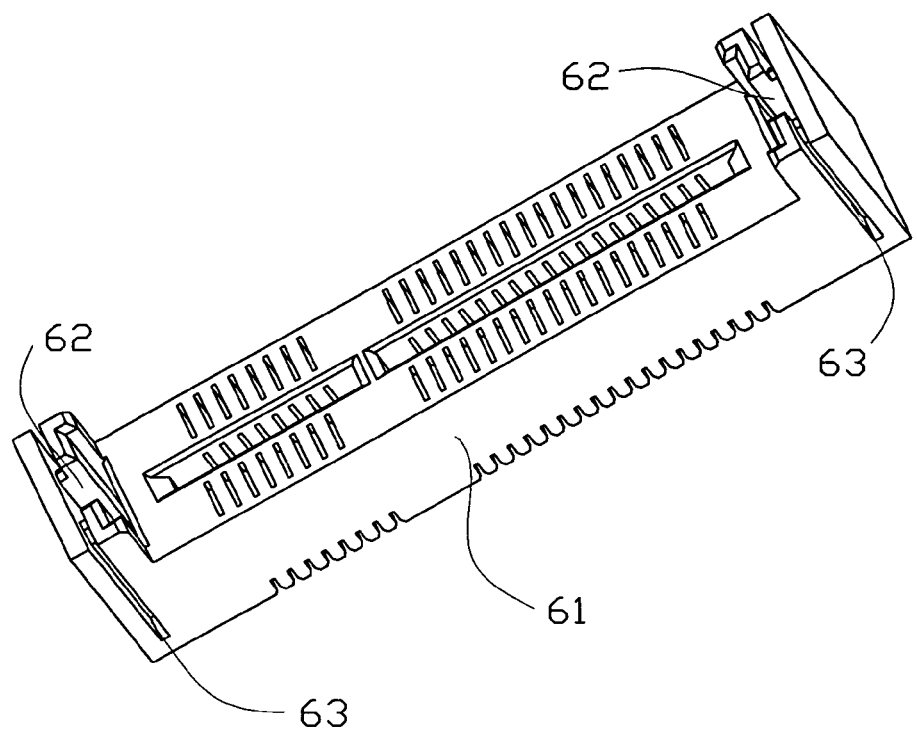
FIG. 14 is the schematic view of the insulating body of the connector showing on the FIG. 13.
Figure 15:
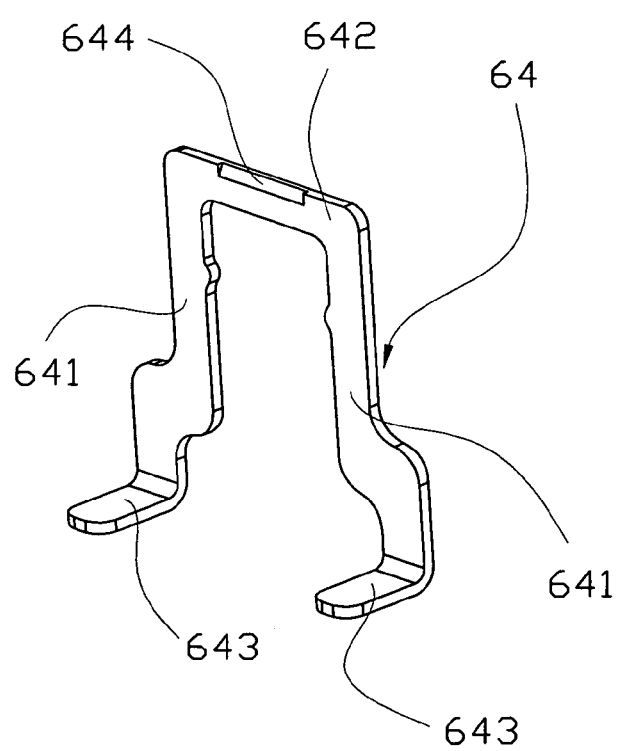
FIG. 15 is the schematic view of the fixing unit of the connector showing on the FIG. 13.
Figure 16:
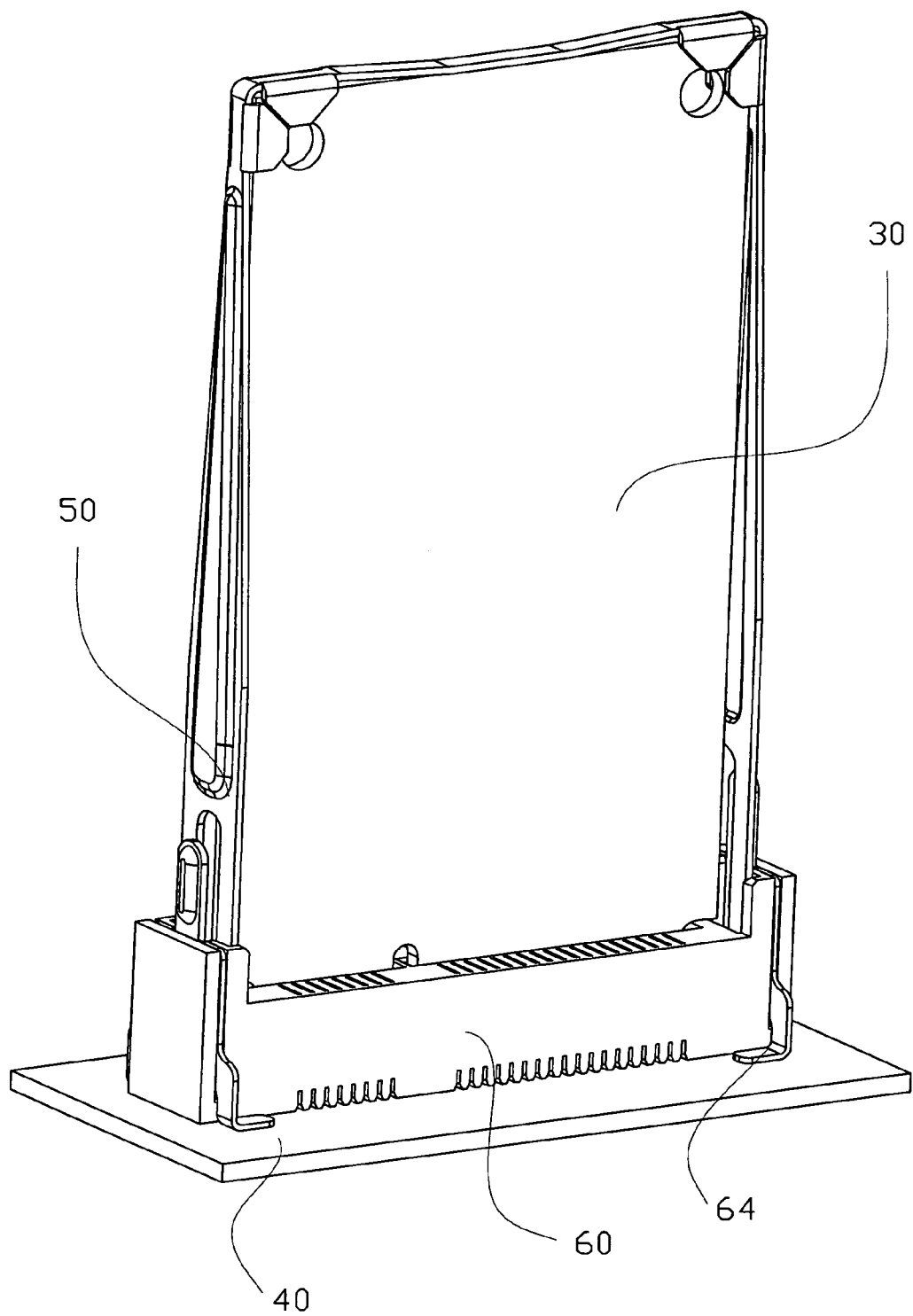
FIG. 16 is the assembled perspective of the connector, expansion card and the circuit board showing on the FIG. 13.
Figure 17:
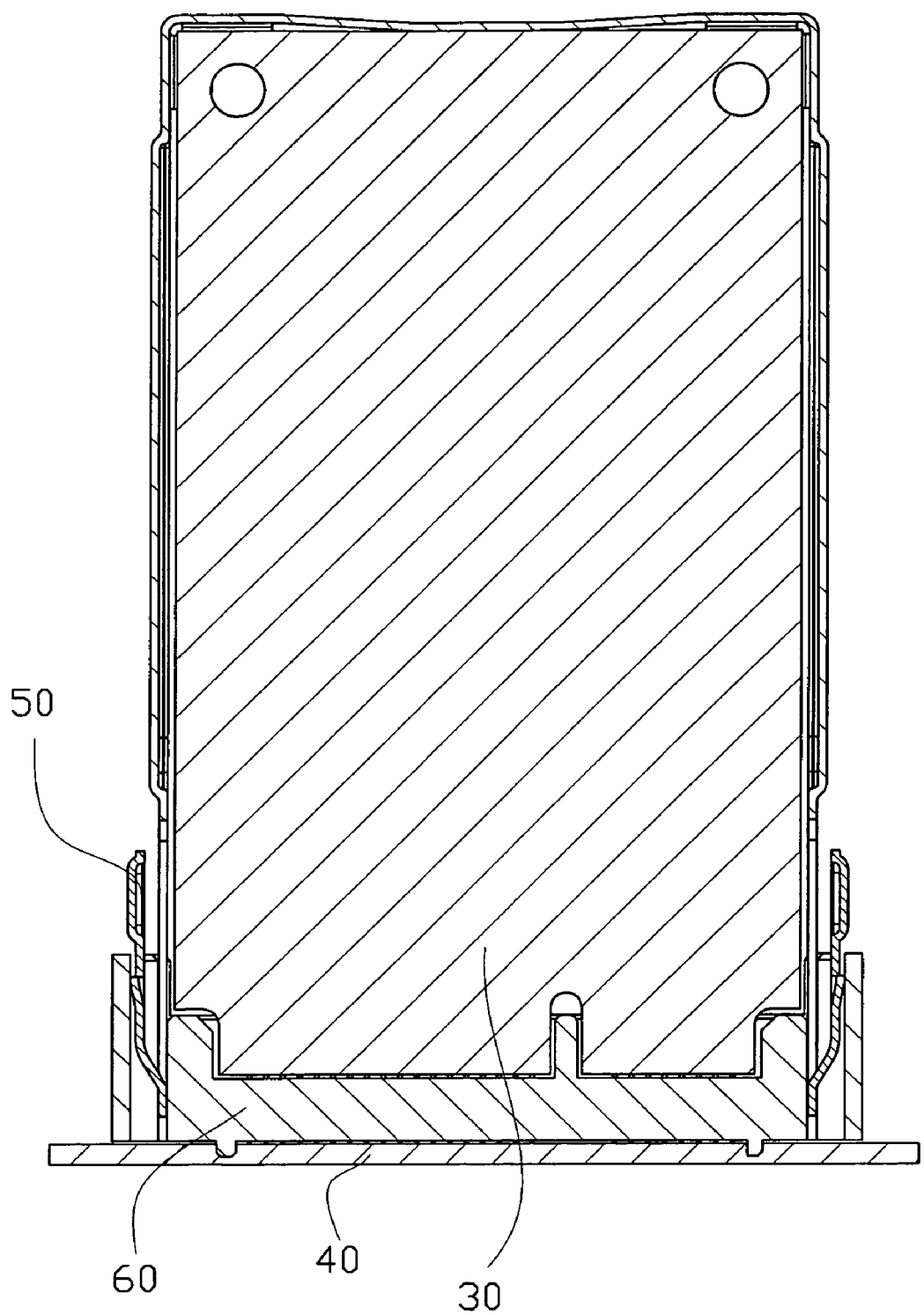
FIG. 17 is the cross-sectional view of the assembled view showing on the FIG. 16.
Figure 18:
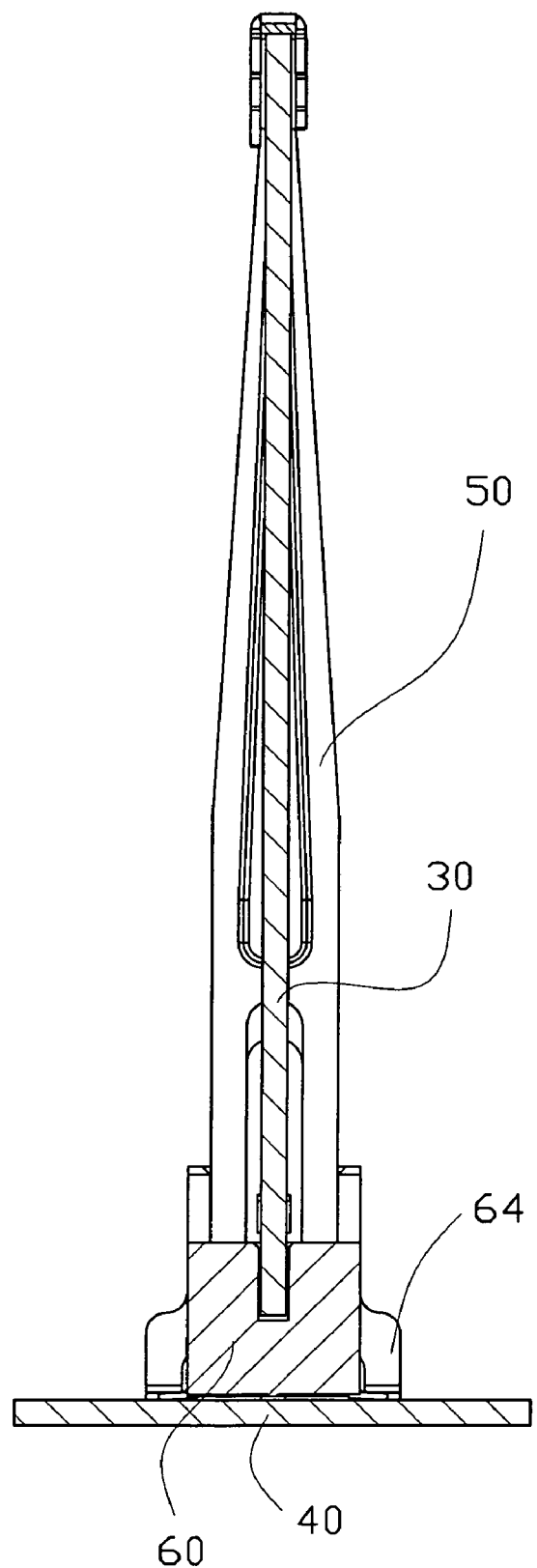
FIG. 18 is the cross-sectional view of the other angle showing on the FIG. 17.

FIGS. 11 to 18 are illustrated to show the second embodiment of the fixing device and using the fixing device of the connector of the present invention. The difference in the above embodiment is the fixing device 50 including two elastic arms 51 and the connecting arm 52 connecting the two elastic arms 52. Each the end of the elastic arms 51 has a buckling portion 512. The buckling portion 512 includes also a connecting portion 513 connecting to the elastic arm 11 and a vertical portion 514 extending from the connecting portion 513. Besides, the vertical portion 514 has a stop block 516 protruded out of the vertical portion 514. The stop block 516 is a wedge shape. The fixing device 50 is fixed in a connector 60. The connector 60 includes an insulating body 61 with a long shape. The two ends of the insulating body 61 have respectively a receiving groove 62 and receiving chamber 63. The receiving groove 62 can pass through to the receiving chamber 63 and the receiving groove 62 is received in the external wall of the receiving groove 62. The connector 60 has two metal fixing units 64 so as to weld the connector 60 to the circuit board 40. Each the fixing unit 64 is received in the receiving chamber 63. The fixing unit 64 includes two vertical arms 641 and a level arm 642 vertical to the two vertical arms 641. The level arm 642 has a long recess 644. The vertical arm 641 has a welding leg 643. The welding leg 643 is formed by bending from a level direction and extending the vertical arm 641. The welding leg 643 can be welded on the circuit board 40 (referring to FIG. 16) so as to fix the connector 60 to the circuit board 40.

When assembling (referring to FIGS. 1 to 18), the fixing unit 64 is installed in the corresponding receiving chamber 63 firstly. Then the connector 61 is welded and fixed on the circuit board 40. After that, the expansion card 30 is installed in the insulating body 61 of the connector 60. The fixing device 10 is fixed on the expansion card 30. The elastic arm 51 is pulled suitably outwards so as to the interior side of the elastic arm 51 can pass through the lateral side of the expansion card 30. Then, the upper end of the right angle of the expansion card 30 is received in the connecting location between the elastic arm 11 and the connecting arm 52 so that the expansion card 30 is received in the fixing device 50. Furthermore, the fixing device 50 is fixed in the connector 60. Firstly, the buckling portion 512 is pushed inwards. The end of the elastic arm 51 is inserted into the receiving groove 62 so that the stop block 516 leans against the interior wall of the receiving groove 62. Whiling the elastic arms 51 is inserted into the receiving groove 62, the stop block 516 of the buckling portion 512 slips through the recess 644 and the stop block 516 presses down the level arm 642 of the fixing unit 64. Then the stop block 516 leans against the interior wall of the receiving groove 62. After the buckling portion 512 is released, the stop block 516 can prevent that buckling portion 112 springs out from the receiving groove 62. Therefore, the fixing device 50 is fixed in the connector 60.

Because the buckling portion 512 of the fixing device 50 of this embodiment has the stop block 516, the stop block 516 can prevent the buckling portion 112 from springing out from the receiving groove 62. The stop block 516 can press down the fixing unit 64 so as to prevent that the fixing unit 64 from slipping in the insulating body 61. Therefore, the embodiment is a preferred embodiment of the present invention.

The fixing device of the present invention has the stop sheet serving to fix the expansion card. The expansion card can not only be fixed firmly on the fixing device, but also do not need any screw. Besides, the buckling portion of the fixing device of the present invention can fix the fixing device in the connector. The integral structure of the present invention is simple and convenient to be assembled. The present invention can not only increase the assembling efficiency, but also reduce the production costs.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A fixing device serving to fix and connect an expansion card inserting in a connector comprising at least one of elastic arm; and the elastic arm having a buckling portion,
    wherein the buckling portion is an elastic strip formed by bending a distal end of the elastic arm,
    wherein the buckling portion is located on an exterior surface of the elastic arm, the exterior surface facing away from the expansion card when the expansion card is inserted into the connector,
    wherein at least one of the distal ends of the elastic arm is bent and extended to form a first stop sheet,
    wherein the fixing device has two elastic arms; between the two elastic arms has a connecting arm so as to connect the two elastic arms; and at least one of the distal ends and at least one of the sides of the connecting arm is bent and extended to form a second stop sheet; and the first stop sheet and the second stop sheet surround a slot of the expansion card.

2. The fixing device as claimed in claim 1, wherein the buckling portion has a stop block.

3. The fixing device as claimed in claim 2, wherein the stop block is a wedge shape.

4. A connector comprising an insulating body and a fixing device; the fixing device including at least one elastic arm and a buckling portion; and the buckling portion is buckled to the two ends of an insulating body, wherein a buckling portion has a stop block located on an exterior surface of the buckling portion, the exterior surface facing away from an expansion card when the expansion card is inserted into the connector, wherein at least one of the distal ends of the elastic arm is bent and extended to form a first stop sheet, wherein the fixing device has two elastic arms; between the two elastic arms has a connecting arm so as to connect the two elastic arms; at least one of the distal ends and at least one of the sides of the connecting arm is bent and extended to form a second stop sheet; and the first stop sheet and the second stop sheet surround a slot of a expansion card.

5. The connector as claimed in claim 4, wherein the connector includes a fixing unit; and the fixing unit has a connecting portion.

* * * * *